(12) United States Patent
Zadesky et al.

(10) Patent No.: US 9,103,021 B2
(45) Date of Patent: Aug. 11, 2015

(54) AMORPHOUS DIAMOND-LIKE CARBON COATINGS FOR INCREASING THE THERMAL CONDUCTIVITY OF STRUCTURAL FRAMES IN PORTABLE ELECTRONIC DEVICES

(75) Inventors: Stephen P. Zadesky, Portola Valley, CA (US); Fletcher R. Rothkopf, Los Altos, CA (US); Anna-Katrina Shedletsky, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 610 days.

(21) Appl. No.: 13/298,842

(22) Filed: Nov. 17, 2011

(65) Prior Publication Data

US 2013/0128462 A1    May 23, 2013

(51) Int. Cl.
*H05K 7/20* (2006.01)
*C23C 16/26* (2006.01)
*H04M 1/02* (2006.01)

(52) U.S. Cl.
CPC ............ *C23C 16/26* (2013.01); *H05K 7/20509* (2013.01); *H04M 1/0202* (2013.01)

(58) Field of Classification Search
USPC ........................ 361/676–678, 679.46–679.54, 361/688–722, 752, 760, 831
See application file for complete search history.

(56) References Cited

U.S. PATENT DOCUMENTS

| | | | |
|---|---|---|---|
| 6,258,237 | B1 | 7/2001 | Gal-Or |
| 7,352,584 | B1 * | 4/2008 | Sung .............................. 361/708 |
| 7,455,824 | B2 | 11/2008 | Nakanishi |
| 7,609,513 | B2 * | 10/2009 | Chang ....................... 361/679.46 |
| 7,791,188 | B2 * | 9/2010 | Sung .............................. 257/706 |
| 8,434,675 | B2 * | 5/2013 | Faith ............................. 235/375 |
| 2006/0240260 | A1 * | 10/2006 | Heino et al. ................... 428/408 |
| 2007/0199678 | A1 | 8/2007 | Hwang |
| 2011/0038120 | A1 | 2/2011 | Merz |

* cited by examiner

*Primary Examiner* — Courtney Smith
(74) *Attorney, Agent, or Firm* — Brownstein Hyatt Farber Schreck, LLP (57) ABSTRACT

The disclosed embodiments provide a component for a portable electronic device. The component includes a structural frame within the portable electronic device and an amorphous diamond-like carbon (DLC) coating deposited on the surfaces and the edges of the structural frame, wherein the amorphous DLC coating increases a thermal conductivity of the structural frame.

20 Claims, 7 Drawing Sheets

AMORPHOUS DIAMOND-LIKE CARBON COATINGS FOR INCREASING THE THERMAL CONDUCTIVITY OF STRUCTURAL FRAMES IN PORTABLE ELECTRONIC DEVICES

BACKGROUND

1. Field

The present embodiments relate to techniques for facilitating heat transfer in portable electronic devices. More specifically, the present embodiments relate to the depositing of an amorphous diamond-like carbon (DLC) coating on a structural frame of a portable electronic device to increase the thermal conductivity of the structural frame.

2. Related Art

A modern portable electronic device typically contains a set of tightly packed components. For example, a mobile phone may include a microphone, display, speakers, camera, buttons, battery, processor, memory, internal storage, and/or ports in a package that is less than 0.5 inches thick, 4-5 inches long, and 2-3 inches wide. Moreover, most components in the portable electronic device generate heat, which must be dissipated to enable safe use of the portable electronic device and improve long-term reliability. For example, heat generated by components in a mobile phone may be spread across the enclosure of the mobile phone to prevent damage to the components and increase user comfort and safety while operating the mobile phone.

However, heat-dissipation mechanisms for portable electronic devices generally involve the use of additional parts and/or materials. For example, heat sinks, cooling fans, heat pipes, thermal spreaders, and/or vents may be used to dissipate heat from components in a laptop computer. Such heat-dissipating parts and/or materials may take up space within the portable electronic devices and may add to the cost of the portable electronic devices.

Hence, space-efficient designs for portable electronic devices may be facilitated by mechanisms that reduce the dependence of the portable electronic devices on conventional heat-dissipating parts and/or materials.

SUMMARY

The disclosed embodiments provide a component for a portable electronic device. The component includes a structural frame within the portable electronic device and an amorphous diamond-like carbon (DLC) coating deposited on the surfaces and the edges of the structural frame, wherein the amorphous DLC coating increases a thermal conductivity of the structural frame.

In some embodiments, the structural frame includes one or more apertures filled with the amorphous DLC coating. The apertures(s) may be formed to facilitate heat dissipation from one or more heat-generating components in the portable electronic device, such as a backlight, a processor, a charging circuit, and/or a power supply.

In some embodiments, the structural frame is affixed to a chassis of the portable electronic device. A display may also be disposed over the structural frame within the portable electronic device.

In some embodiments, the structural frame includes a set of side supports. The side supports may be created by bending the structural frame along one or more of the edges. The side supports may also be created after the amorphous DLC coating is deposited on the surfaces and the edges of the sheet.

In some embodiments, the structural frame is composed of at least one of stainless steel, zinc, magnesium, aluminum, copper, and glass-filled plastic.

In some embodiments, the amorphous DLC coating is about 18 microns thick.

In some embodiments, the amorphous DLC coating is deposited on the surfaces and the edges of the structural frame using a plasma-assisted vapor deposition technique.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a fieldprogrammable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
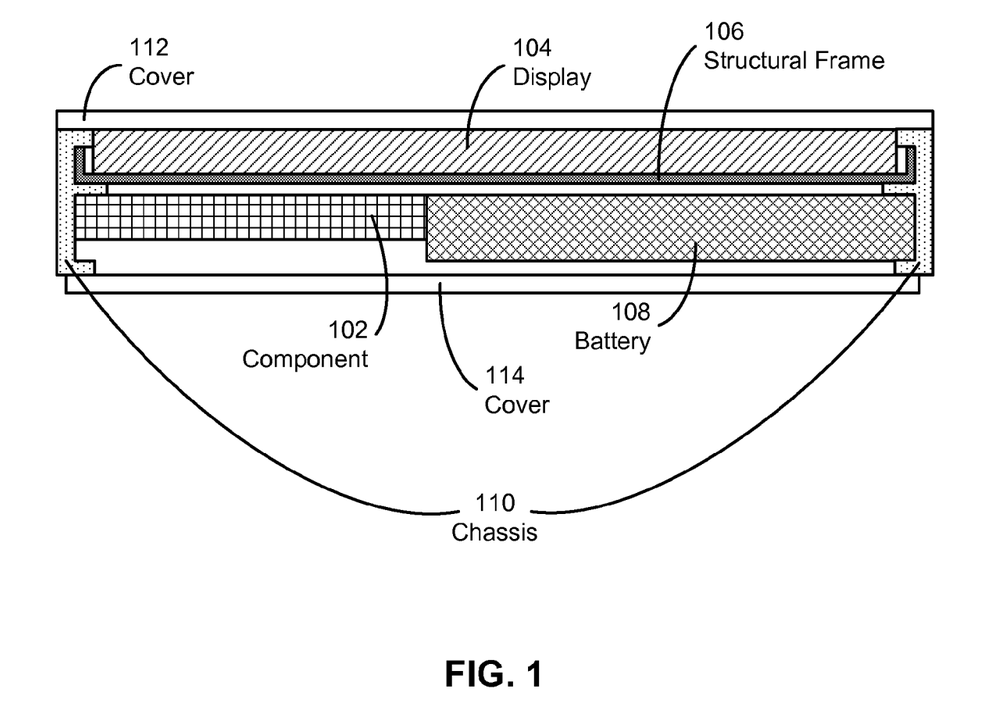
FIG. 1 shows a cross-sectional view of a portable electronic device in accordance with the disclosed embodiments.

FIG. 1 shows a cross-sectional view of a portable electronic device in accordance with the disclosed embodiments. The portable electronic device may correspond to a mobile phone, personal digital assistant (PDA), laptop computer, tablet computer, portable media player, digital camera, and/or other type of battery-powered electronic device. As shown in FIG. 1, the portable electronic device includes a component 102, a display 104, and a battery 108 housed within a chassis 110.

Component 102 may be used to operate the portable electronic device. For example, component 102 may be a processor, memory, backlight, charging circuit, and/or power supply. Component 102 may be powered by battery 108 and/or by an external power source (e.g., power adapter) during operation.

Display 104 may facilitate interaction between a user and the portable electronic device. For example, display 104 may correspond to a touchscreen that receives capacitive touch input from the user and modifies the portable electronic device's graphical output based on the touch input.

Battery 108 may correspond to a lithium-polymer battery, lithium-ion battery, and/or other type of power source for the portable electronic device. For example, battery 108 may correspond to a lithium-polymer battery that includes one or more cells packaged in flexible pouches. The cells may then be connected in series and/or in parallel and used to supply power to component 102, display 104, and/or other parts of the portable electronic device.

Structural support for the portable electronic device may be provided by two covers 112-114 and chassis 110. For example, covers 112-114 may correspond to panels of aluminosilicate glass that are affixed to the top and bottom of a stainless steel chassis 110, respectively, using a set of screws. The enclosure formed by covers 112-114 and chassis 110 may protect components within the portable electronic device from physical damage and/or exposure to the external environment while maintaining a thin, compact form factor in the portable electronic device.

Additional structural support to the portable electronic device may be provided by a structural frame 106 disposed directly underneath display 104. Structural frame 106 may correspond to a rigid sheet of material (e.g., stainless steel) that is affixed to chassis 110 (e.g., using a set of screws and/or a bonding material). Structural frame 106 may thus form a center plane within the portable electronic device that further protects display 104 and increases the stiffness of the portable electronic device.

Those skilled in the art will appreciate that the operation of the portable electronic device may generate heat, with increased use of components (e.g., component 102) resulting in an increase in the temperature(s) of the components. For example, processor-intensive operations on the portable electronic device may cause the central processing unit (CPU) of the portable electronic device to heat up. Such localized heat buildup may cause discomfort and/or injury to a user, and may further cause the components to lose reliability, behave unpredictably, and/or fail prematurely.

As a result, the portable electronic device may include mechanisms for dissipating heat from the components. For example, a layer of thermal spreader material (not shown) may be positioned above both battery 108 and component 102 to allow heat generated by component 102 to spread to battery 108, the enclosure of the portable electronic device, and/or other areas of the portable electronic device. In other words, the thermal spreader material may facilitate thermal transfer within the portable electronic device.

However, heat-dissipation materials may take up space within the portable electronic device and/or increase the material and assembly costs for the portable electronic device. For example, a 1-mm layer of thermal spreader material may occupy 20% of the thickness of a 5-mm-thick portable media player. The thermal spreader material may additionally be factored into the cost of parts for the portable electronic device and/or the cost of assembling the portable electronic device.

In one or more embodiments, thermal transfer in the portable electronic device is facilitated by applying an amorphous diamond-like carbon (DLC) coating to the surfaces and edges of structural frame 106. The amorphous DLC coating may be applied using a plasma-assisted vapor deposition technique before and/or after structural frame 106 is formed. As discussed in further detail below, the addition of the amorphous DLC coating to structural frame 106 may increase the thermal conductivity of structural frame 106 and facilitate heat dissipation from heat-generating components (e.g., component 102) in the portable electronic device without substantially increasing the thickness of the portable electronic device.

Figure 2:
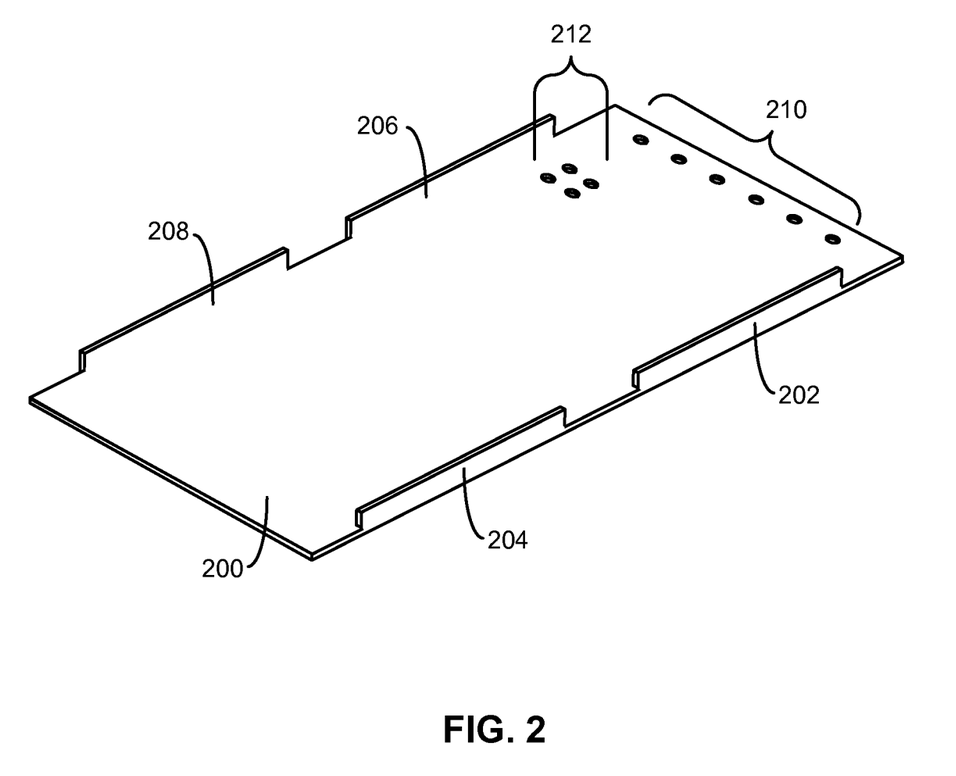
FIG. 2 shows a structural frame for a portable electronic device in accordance with the disclosed embodiments.

FIG. 2 shows a structural frame 200 for a portable electronic device in accordance with the disclosed embodiments. Structural frame 200 may correspond to a rigid sheet of material that provides structural support to a portable electronic device. For example, structural frame 200 may be formed from a 0.3-mm-thick sheet of stainless steel, zinc, magnesium, aluminum, copper, and/or glass-filled plastic. Structural frame 200 may then be disposed within a center plane of the portable electronic device to protect a display of the portable electronic device and/or increase the stiffness of the electronic device. For example, structural frame 200 may be placed on top of a mounting surface in a chassis of the portable electronic device and affixed to the chassis using a set of screws and/or a bonding material.

Structural frame 200 also includes a set of side supports 202-208. Side supports 202-208 may be formed by bending structural frame 200 along one or more edges. For example, side supports 202-208 may be formed by creating 90-degree bends in the sheet near the left and/or right edges of the sheet. Structural frame 200 may then be installed within the portable electronic device such that side supports 202-208 contact the sides of the chassis. Side supports 202-208 may thus improve the rigidity of structural frame 200 without increasing the thickness of structural frame 200.

As mentioned above, an amorphous DLC coating may be applied to structural frame 200. For example, a plasma-assisted vapor deposition technique may be used to apply the amorphous DLC coating to both electrically conductive and electrically nonconductive materials (e.g., for structural frame 200). The flexibility of amorphous DLC may allow the amorphous DLC coating to be applied before or after side supports 202-208 are formed, as discussed below with respect to FIGS. 5-6.

In addition, the amorphous DLC coating may increase the thermal conductivity of structural frame 200 without substantially increasing the thickness of structural frame 200. For example, an 18-micron-thick amorphous DLC coating may have a thermal conductivity of approximately 950 $Wm^{-1}K^{-1}$. As a result, the deposition of the 18-micron-thick amorphous DLC coating onto a stainless steel structural frame 200 may increase the thermal conductivity of structural frame 200 from approximately 16 Wm$^{-1}$K$^{-1}$ to approximately 116 Wm$^{-1}$K$^{-1}$ while adding less than 0.1 mm to the thickness of structural frame 200. The spreading of heat across structural frame 200 may further be facilitated by depositing the amorphous DLC coating on surfaces and edges of structural frame 200, as discussed in further detail below with respect to FIG. 3.

To further facilitate heat transfer in the portable electronic device, the amorphous DLC coating may be combined with other techniques for increasing the thermal conductivity of structural frame 200. Such techniques may include the selection of materials to optimize both stiffness and heat transfer in structural frame 200. For example, structural frame 200 may be formed from two outer layers of stainless steel bonded to an inner layer of copper using a cladding technique. The stainless steel layers may maintain stiffness in structural frame 200, while the copper layer may increase the thermal conductivity of structural frame 200 from 16 Wm$^{-1}$K$^{-1}$ to about 200 Wm$^{-1}$K$^{-1}$. The addition of an amorphous DLC coating to structural frame 200 may further increase the thermal conductivity of structural frame 200 by another 50-60 Wm$^{-1}$K$^{-1}$, resulting in a thermal conductivity of about 250-260 Wm$^{-1}$K$^{-1}$ for structural frame 200.

In addition, a set of apertures 210-212 may be formed in structural frame 200 near heat-generating components in the portable electronic device. For example, apertures 210 may be positioned below a light-emitting diode (LED) backlight array for a display in the portable electronic device, while apertures 212 may be positioned above a processor in the portable electronic device. Apertures 210-212 may also be filled with the amorphous DLC coating to facilitate heat dissipation from the heat-generating components, as discussed below with respect to FIG. 4.

Figure 3:
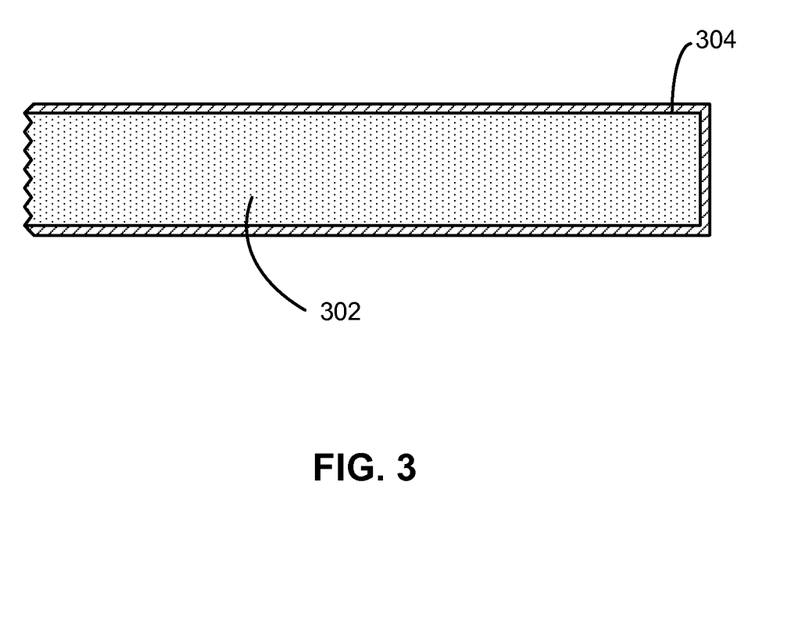
FIG. 3 shows a cross-sectional view of a component for a portable electronic device in accordance with the disclosed embodiments.

FIG. 3 shows a cross-sectional view of a component for a portable electronic device in accordance with the disclosed embodiments. The component includes a structural frame 302 and an amorphous DLC coating 304 deposited on the structural frame. For example, structural frame 302 may be formed from a 0.3-mm-thick sheet of stainless steel, magnesium, aluminum, copper, and/or glass-filled plastic. An 18-micron-thick amorphous DLC coating 304 may then be deposited onto the sheet using a plasma-assisted vapor deposition technique.

More specifically, FIG. 3 shows a cross-sectional view of the component near an edge of structural frame 302. As shown in FIG. 3, amorphous DLC coating 304 forms a continuous coating along the top surface, edge, and bottom surface of structural frame 302. The continuous coating may facilitate heat transfer in the portable electronic device by allowing the heat to spread across all surfaces of structural frame 302. For example, amorphous DLC coating 304 may allow heat generated by an LED backlight array disposed above structural frame 302 to be dissipated along the top surface of structural frame 302, then around the edges of structural frame 302, and finally along the bottom surface of structural frame 302. Consequently, amorphous DLC coating 304 may spread heat from heat-generating components to other areas of the portable electronic device more effectively than an amorphous DLC coating that is applied only to the top and/or bottom surface of structural frame 302.

Figure 4:
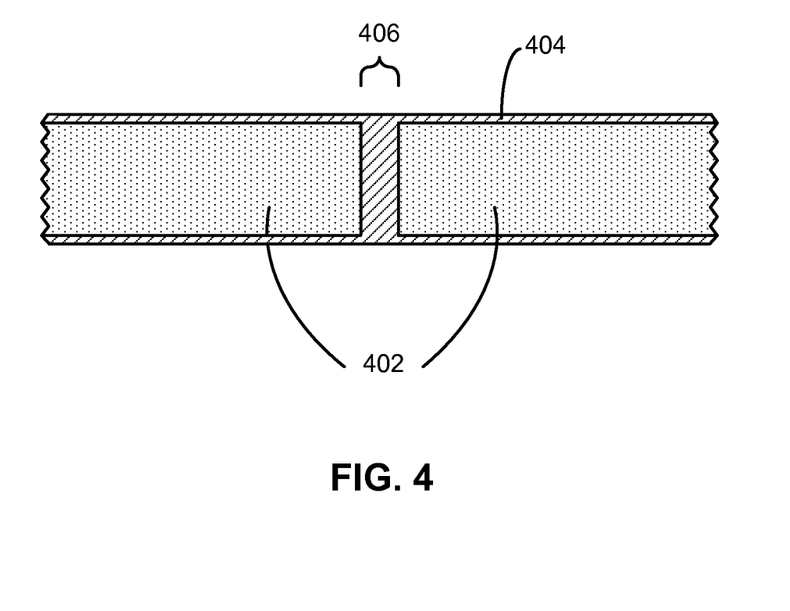
FIG. 4 shows a cross-sectional view of a component for a portable electronic device in accordance with the disclosed embodiments.

FIG. 4 shows a cross-sectional view of a component for a portable electronic device in accordance with the disclosed embodiments. Like the component of FIG. 3, the component of FIG. 4 includes a structural frame 402 and an amorphous DLC coating 404 deposited on structural frame 402.

The cross-sectional view of FIG. 4 also shows an aperture 406 in structural frame 402. Aperture 406 may be formed in a sheet of material used to create structural frame 402 and filled with amorphous DLC coating 404. Aperture 406 may then be used to dissipate heat from a heat-generating component in the portable electronic device, such as a processor, backlight, charging circuit, and/or power supply. For example, aperture 406 may be positioned on top of a "hotspot" in a processor, or aperture 406 and/or other apertures in structural frame 402 may be arranged in a geometric pattern around the top of the processor. Heat generated by the processor may then be spread by amorphous DLC coating 404 along the bottom surface of structural frame 402 as well as through aperture 406 to the top surface of structural frame 402. Aperture 406 may thus improve the dissipation of heat from heat-generating components in the portable electronic device without affecting the stiffness of structural frame 402.

Figure 5:
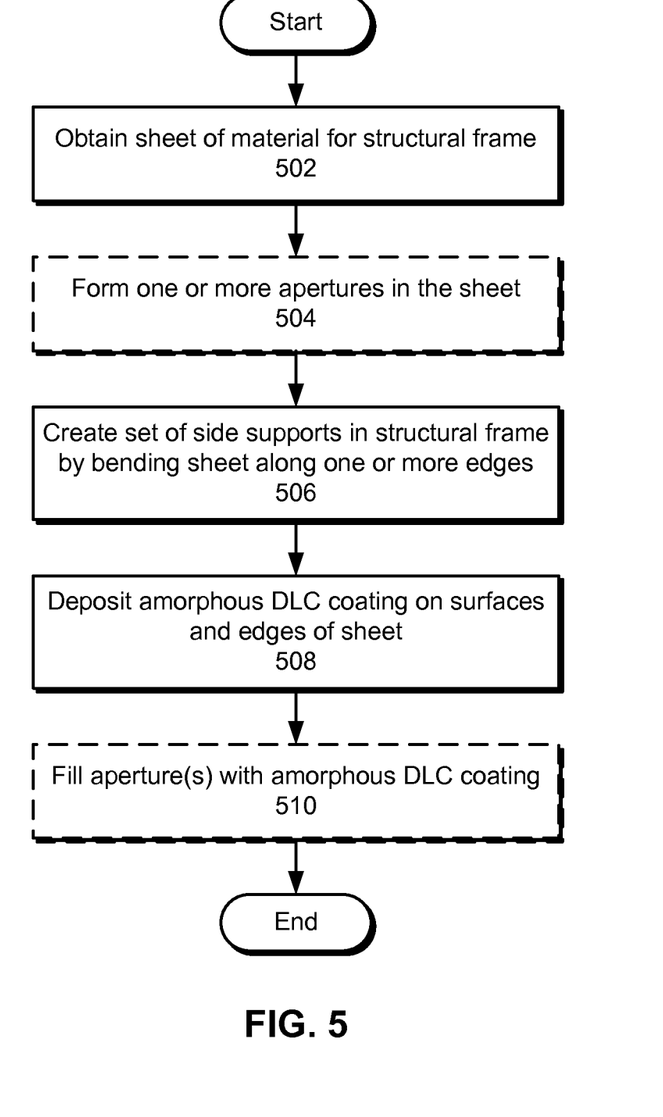
FIG. 5 shows a flowchart illustrating the process of manufacturing a component in a portable electronic device in accordance with the disclosed embodiments.

FIG. 5 shows a flowchart illustrating the process of manufacturing a component in a portable electronic device in accordance with the disclosed embodiments. In one or more embodiments, one or more of the steps may be omitted, repeated, and/or performed in a different order. Accordingly, the specific arrangement of steps shown in FIG. 5 should not be construed as limiting the scope of the embodiments.

First, a sheet of material for a structural frame is obtained (operation 502). The sheet may be composed of a rigid and/or thermally conductive material such as steel, zinc, magnesium, aluminum, copper, and glass-filled plastic. One or more apertures are optionally formed in the sheet (operation 504). For example, the aperture(s) may be formed by drilling small holes in the sheet near the locations of heat-generating components to be placed above and/or below the structural frame in the portable electronic device.

Next, a set of side supports is created in the structural frame by bending the sheet along one or more of the structural frame's edges (operation 506). The side supports may increase the rigidity of the structural frame without increasing the thickness of the structural frame.

After the side supports are created, an amorphous DLC coating is deposited on the surfaces and edges of the sheet (operation 508). The amorphous DLC coating may also be used to fill one or more apertures formed in the sheet (operation 510) to facilitate heat dissipation from heat-generating components near the aperture(s). The amorphous DLC coating may increase the thermal conductivity of the structural frame without significantly increasing the thickness of the structural frame. For example, a plasma-assisted vapor deposition technique may be used to deposit an 18-micron-thick amorphous DLC coating onto a 0.3-mm-thick sheet of stainless steel. The 18-micron-thick amorphous DLC coating may thus increase the thickness of the sheet by less than 0.1 mm while increasing the thermal conductivity of the stainless steel sheet by approximately 100 Wm$^{-1}$K$^{-1}$.

Figure 6:
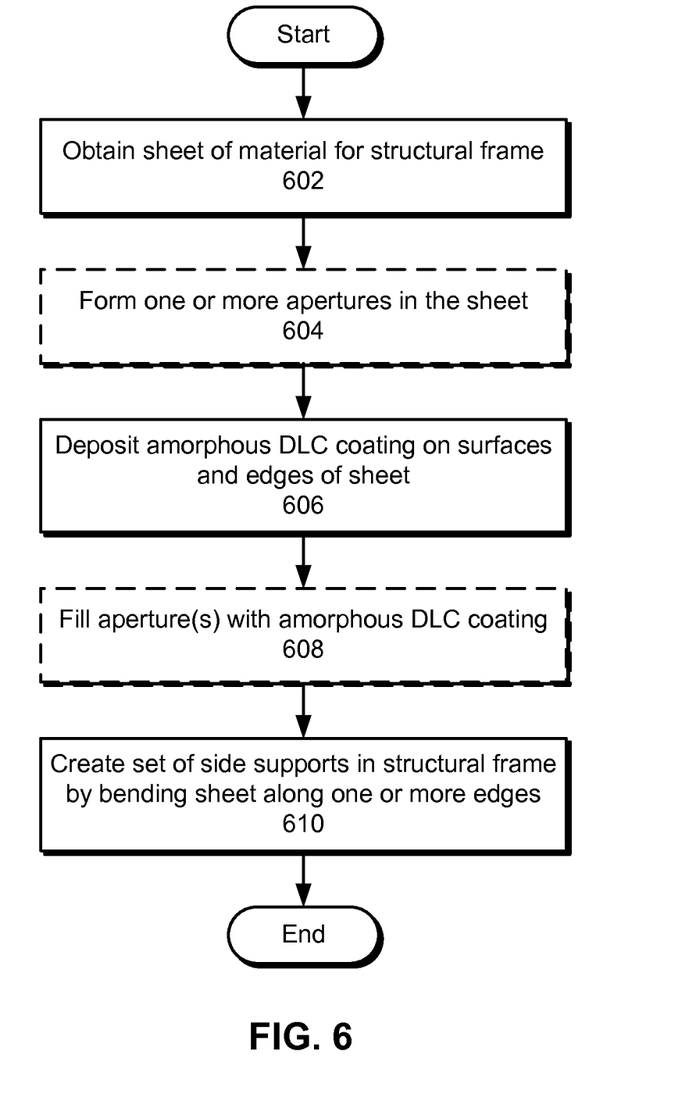
FIG. 6 shows a flowchart illustrating the process of manufacturing a component in a portable electronic device in accordance with the disclosed embodiments.

FIG. 6 shows a flowchart illustrating the process of manufacturing a component in a portable electronic device in accordance with the disclosed embodiments. In one or more embodiments, one or more of the steps may be omitted, repeated, and/or performed in a different order. Accordingly, the specific arrangement of steps shown in FIG. 6 should not be construed as limiting the scope of the embodiments.

Like the process of FIG. 5, the manufacturing process of FIG. 6 may begin by obtaining a sheet of material for a structural frame (operation 602) and optionally forming one or more apertures in the sheet (operation 604). However, unlike the process of FIG. 5, an amorphous DLC coating is deposited onto the surfaces and edges of the sheet (operation 606) and/or used to fill the aperture(s) (operation 608) before the side supports are created (operation 610). In particular, the flexibility of the amorphous DLC coating may allow the amorphous DLC coating to conform to the shape of the sheet without chipping and/or cracking, even after the sheet is bent. In turn, the manufacturing process for the component may be optimized for efficiency, cost, and/or ease instead of the prevention of cracks and/or chips in a brittle coating deposited on a sheet of material.

Figure 7:
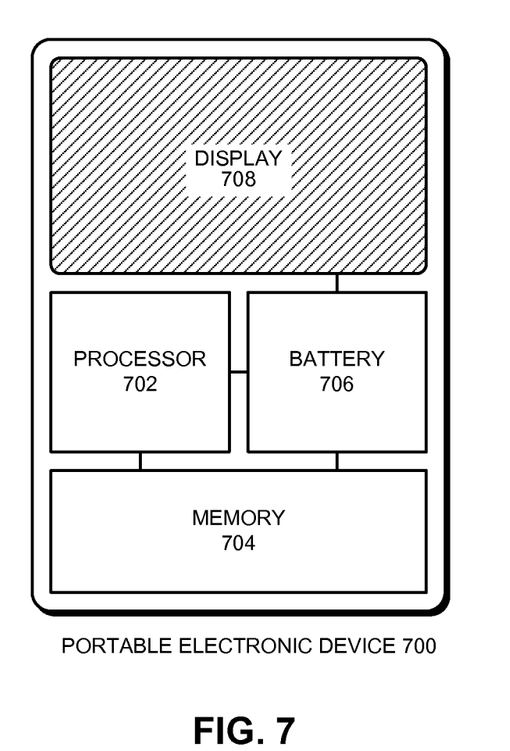
FIG. 7 shows a portable electronic device in accordance with the disclosed embodiments.

The above-described structural frame can generally be used in any type of electronic device. For example, FIG. 7 illustrates a portable electronic device 700 which includes a processor 702, a memory 704 and a display 708, which are all powered by a battery 706. Portable electronic device 700 may correspond to a laptop computer, tablet computer, mobile phone, PDA, portable media player, digital camera, and/or other type of battery-powered electronic device. Display 708 may be disposed over the structural frame within the chassis of portable electronic device 700. In addition, an amorphous DLC coating may be deposited on the surfaces and the edges of the structural frame to increase the thermal conductivity of the structural frame.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A component for a portable electronic device, comprising:
    an enclosure defining a fully-enclosed volume;
    a structural frame disposed within the fully-enclosed volume of the enclosure and affixed to an internal surface of the enclosure; and
    an amorphous diamond-like carbon (DLC) coating deposited on the surfaces of the structural frame, wherein the amorphous DLC coating increases a thermal conductivity of the structural frame.

2. The component of claim 1, wherein the structural frame comprises one or more apertures filled with the amorphous DLC coating.

3. The component of claim 2, wherein the one or more apertures are formed to facilitate heat dissipation from one or more heat-generating components in the portable electronic device.

4. The component of claim 1, wherein the structural frame comprises a set of side supports, and wherein the side supports are created by bending the structural frame along one or more edges.

5. The component of claim 1, wherein the structural frame comprises at least one of stainless steel, zinc, magnesium, aluminum, copper, and glass-filled plastic.

6. The component of claim 1, wherein the amorphous DLC coating is about 18 microns thick.

7. The component of claim 1, wherein the amorphous DLC coating is deposited on the surfaces of the structural frame using a plasma-assisted vapor deposition technique.

8. A portable electronic device, comprising:
    a chassis defining an enclosed space;
    one or more heat-generating components disposed within the chassis;
    a structural frame disposed within the enclosed space of the chassis and affixed to the chassis; and
    an amorphous diamond-like carbon (DLC) coating deposited on the surfaces of the structural frame, wherein the amorphous DLC coating increases a thermal conductivity of the structural frame.

9. The portable electronic device of claim 8, further comprising:
    a display disposed over the structural frame.

10. The portable electronic device of claim 8, wherein the structural frame comprises one or more apertures filled with the amorphous DLC coating.

11. The portable electronic device of claim 10, wherein the one or more apertures are formed to facilitate heat dissipation from the one or more heat-generating components.

12. The portable electronic device of claim 8, wherein the one or more heat-generating components is at least one of a backlight, a processor, a charging circuit, and a power supply.

13. The portable electronic device of claim 8, wherein the structural frame comprises a set of side supports, and wherein the side supports are created by bending the structural frame along one or more edges.

14. The portable electronic device of claim 8, wherein the structural frame comprises at least one of stainless steel, zinc, magnesium, aluminum, copper, and glass-filled plastic.

15. The portable electronic device of claim 8, wherein the amorphous DLC coating is about 18 microns thick.

16. The portable electronic device of claim 8, wherein the amorphous DLC coating is deposited on the surfaces of the structural frame using a plasma-assisted vapor deposition technique.

17. The component of claim 2, wherein the one or more apertures are positioned near one or more heat-generating components in the portable electronic device.

18. The component of claim 17, wherein the heat-generating components include a light-emitting diode (LED) backlight array.

19. The component of claim 1, wherein the DLC coating is configured to conduct heat along the surface of the frame to dissipate heat generated from one or more heat-generating components in the portable electronic device.

20. The component of claim 8, wherein the structural frame is configured to increase the stiffness of the portable electronic device.

* * * * *